United States Patent
Zhou et al.

(10) Patent No.: US 11,864,357 B2
(45) Date of Patent: Jan. 2, 2024

(54) DOUBLE-SIDED COOLING COLD PLATES WITH OVERHANGING HEAT SINKS AND THROUGH BODY BUSBAR FOR HIGH-POWER DENSITY POWER ELECTRONICS

(71) Applicants: TOYOTA MOTOR ENGINEERING & MANUFACTURING NORTH AMERICA, INC., Plano, TX (US); University of Colorado Boulder, Boulder, CO (US)

(72) Inventors: Feng Zhou, Ann Arbor, MI (US); Yuqing Zhou, Ann Arbor, MI (US); Ercan Mehmet Dede, Ann Arbor, MI (US); Robert Erickson, Boulder, CO (US); Dragan Maksimovic, Boulder, CO (US); Vivek Sankaranarayanan, Boulder, CO (US); Yucheng Gao, Boulder, CO (US)

(73) Assignees: Toyota Motor Engineering and Manufacturing North America, Inc., Plano, TX (US); University of Colorado Boulder, Boulder, CO (US)

( * ) Notice: Subject to any disclaimer, the term of this patent is extended or adjusted under 35 U.S.C. 154(b) by 302 days.

(21) Appl. No.: 17/329,727

(22) Filed: May 25, 2021

(65) Prior Publication Data
US 2022/0386509 A1 Dec. 1, 2022

(51) Int. Cl.
H05K 7/20 (2006.01)

(52) U.S. Cl.
CPC ......... *H05K 7/20509* (2013.01); *H05K 7/209* (2013.01); *H05K 7/20254* (2013.01)

(58) Field of Classification Search
CPC .......... H05K 7/20327; H05K 7/20509; H05K 7/209; H05K 7/20254
See application file for complete search history.

(56) References Cited

U.S. PATENT DOCUMENTS

| | | |
|---|---|---|
| 7,916,480 B2 | 3/2011 | Woody et al. |
| 9,437,523 B2 | 9/2016 | Joshi et al. |
| 9,445,526 B2 | 9/2016 | Zhou et al. |

(Continued)

FOREIGN PATENT DOCUMENTS

WO 2017031596 A1 3/2017

*Primary Examiner* — Jacob R Crum
(74) *Attorney, Agent, or Firm* — Dinsmore & Shohl LLP

(57) ABSTRACT

A double-sided cold plate includes a manifold comprising openings extending from a first surface of the manifold through the manifold to a second surface of the manifold forming recesses within the manifold and an inlet channel and an outlet channel fluidly coupled to the recesses within the manifold, a plurality of first heat sinks coupled to the first surface of the manifold enclosing the openings on the first surface, and a plurality of second heat sinks positioned adjacent each other along a length of the manifold and coupled to the second surface of the manifold, enclosing the openings on the second surface, a width of the plurality of second heat sinks is greater than a width of the manifold thereby forming an overhanging portion on each lengthwise side of the manifold, the overhanging portion configured to mechanically support a plurality of electrical components positioned around a perimeter of the manifold.

20 Claims, 12 Drawing Sheets

(56) References Cited

U.S. PATENT DOCUMENTS

| | | |
|---|---|---|
| 9,980,415 B2 | 5/2018 | Zhou et al. |
| 10,798,855 B2 | 10/2020 | Uneme |
| 2005/0128705 A1* | 6/2005 | Chu ................ H01L 23/473 361/689 |
| 2006/0002087 A1* | 1/2006 | Bezama ............ H01L 23/473 257/E23.098 |
| 2010/0012294 A1* | 1/2010 | Bezama ........... H01L 23/3672 165/80.4 |
| 2012/0257354 A1* | 10/2012 | Dede ............... H01L 23/473 361/689 |
| 2016/0174357 A1* | 6/2016 | Paine ................ H01R 12/72 361/709 |
| 2017/0102194 A1* | 4/2017 | Choi ............... H05K 7/20927 |
| 2020/0280239 A1 | 9/2020 | Zhou et al. |
| 2021/0176896 A1* | 6/2021 | Yang .............. H05K 7/20254 |

* cited by examiner

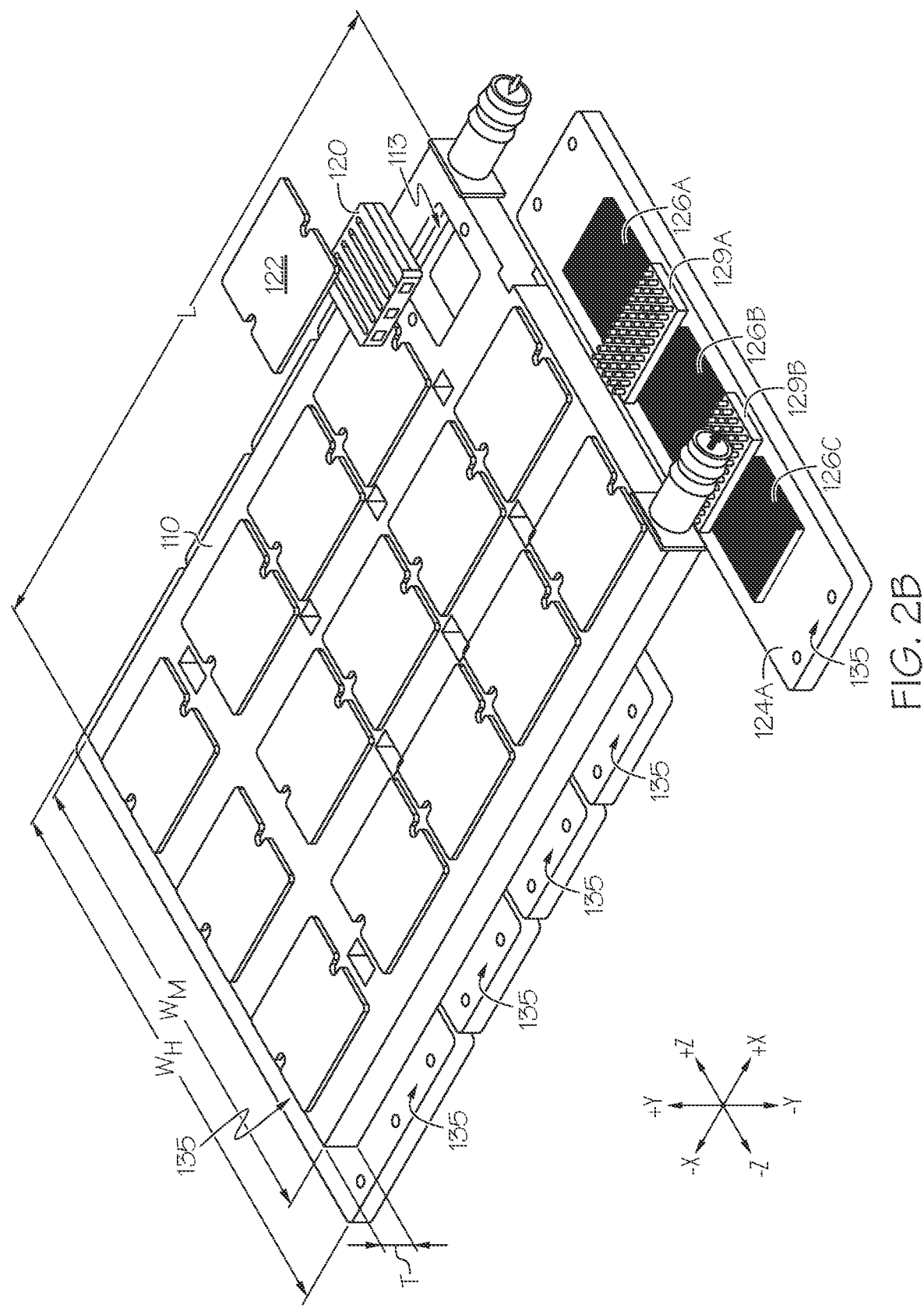

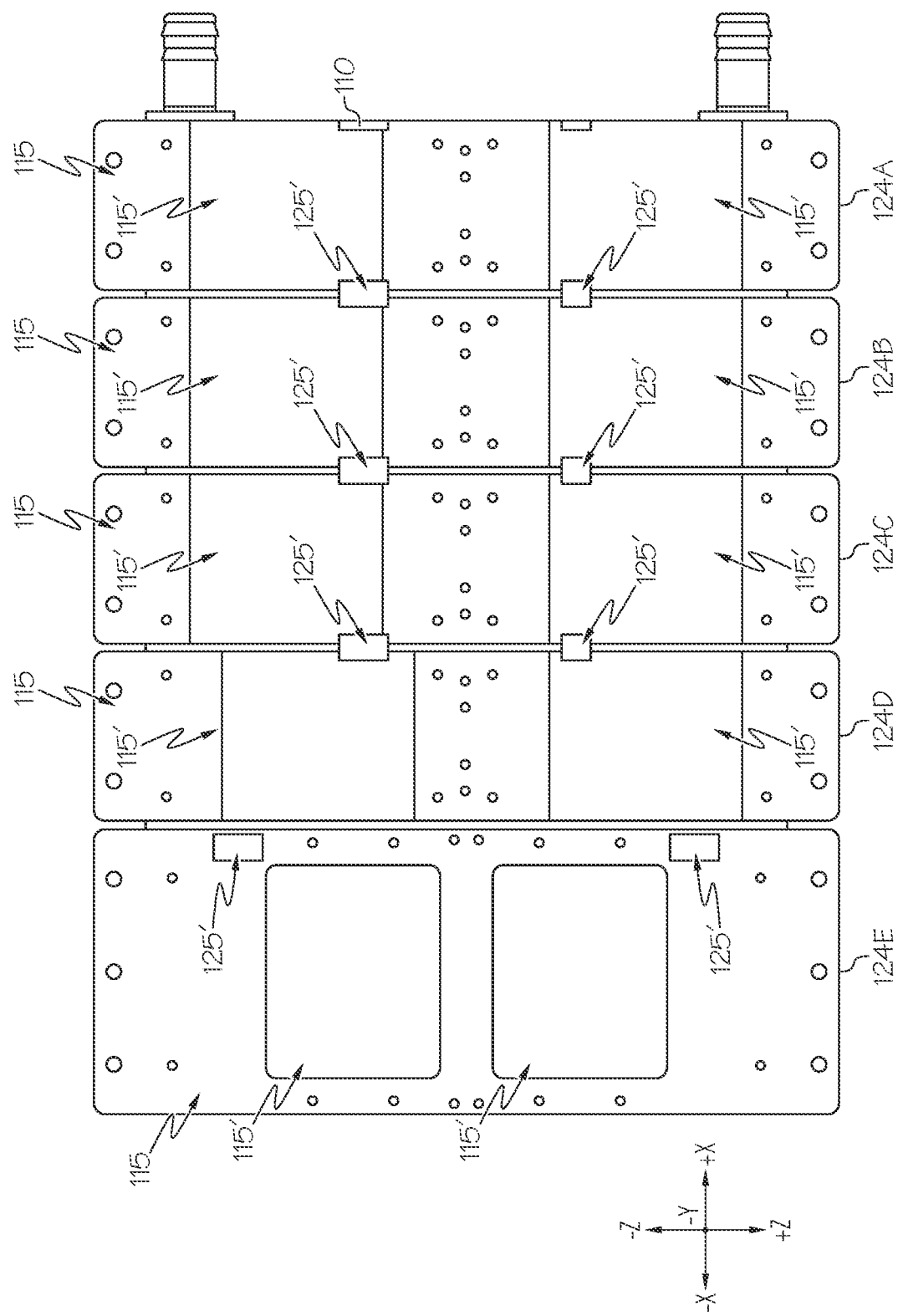

DOUBLE-SIDED COOLING COLD PLATES WITH OVERHANGING HEAT SINKS AND THROUGH BODY BUSBAR FOR HIGH-POWER DENSITY POWER ELECTRONICS

STATEMENT OF GOVERNMENT INTEREST

The subject matter of the present disclosure was developed with government support under Department of Energy Cooperative Agreement DE-AR0000897 awarded by the U.S. Department of Energy. Accordingly, the government has certain rights in the subject matter of the present disclosure.

TECHNICAL FIELD

The present specification generally relates to double-sided manifold cooling assemblies and, more particularly, to cold plates with overhanging heat sinks and through-body bus bars for high-power density power electronics.

BACKGROUND

Heat management devices may be coupled to a heat generation device, such as a power electronics device, to remove heat and lower the operating temperature of the heat generating device. A cooling fluid may be introduced to the heat management device, where it receives heat from the heat management device, primarily through convective and/ or conductive heat transfer. The cooling fluid is then removed from the heat management device, thereby removing heat from the heat generating device. In one example, fluid may be directed in a jet in a localized region at a high velocity such that the fluid impinges a surface of the heat management device coupled to the heat generating device. As power electronic devices are designed to operate at increased power levels, the power electronics devices generate a corresponding increased amount of heat flux. The increase in heat flux generated by the power electronics devices may render conventional heat sinks inadequate to reject sufficient heat to maintain a desired operating temperature in the power electronics device. Further, as power electronics modules are incorporated into increasingly compact and variable arrangements, more configurable cooling assemblies are desired.

SUMMARY

In one aspect, a double-sided cold plate includes a manifold comprising openings extending from a first surface of the manifold through the manifold to a second surface of the manifold forming recesses within the manifold and an inlet channel and an outlet channel fluidly coupled to the recesses within the manifold, a plurality of first heat sinks coupled to the first surface of the manifold enclosing the openings on the first surface, and a plurality of second heat sinks positioned adjacent each other along a length of the manifold and coupled to the second surface of the manifold, enclosing the openings on the second surface, a width of the plurality of second heat sinks is greater than a width of the manifold thereby forming an overhanging portion on each lengthwise side of the manifold, the overhanging portion configured to mechanically support a plurality of electrical components positioned around a perimeter of the manifold.

In another aspect, a power electronic system includes a double-sided cold plate having a manifold, a plurality of first heat sinks coupled to a first surface of the manifold, a plurality of second heat sinks positioned adjacent each other along a length of the manifold and coupled to a second surface of the manifold, a width of the plurality of second heat sinks is greater than a first width of the manifold thereby forming an overhanging portion on each lengthwise side of the manifold. The power electronic system further includes a plurality of capacitors mechanically supported on and thermally coupled to the overhanging portion of the plurality of second heat sinks, a plurality of power modules thermally coupled to the plurality of first heat sinks, and a plurality of inductors thermally coupled to the plurality of second heat sinks.

These and additional objects and advantages provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

FIG. 2B schematically depicts a partially exploded top perspective view of the double-sided cold plate depicted in FIG. 2A according to one or more embodiments shown and described herein;

FIG. 2G schematically depicts a bottom view of the double-sided cold plate depicted in FIG. 2A according to one or more embodiments shown and described herein;

DETAILED DESCRIPTION

Figure 1A:
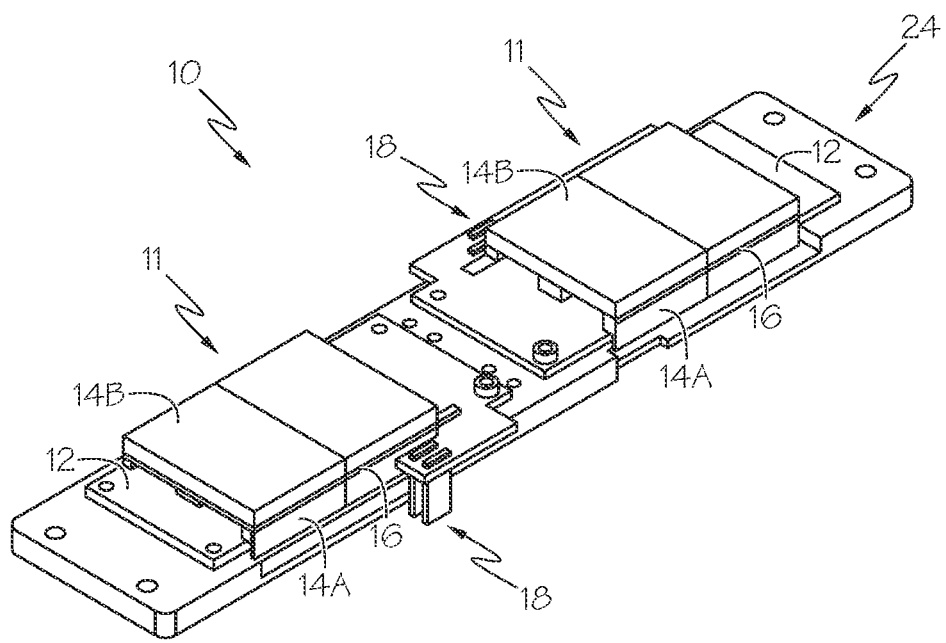
FIG. 1A schematically depicts a perspective view of an inductor for a DC-DC converter according to one or more embodiments shown and described herein.

Embodiments of present disclosure include a configurable, double-sided cooling manifold for cooling power electronic components and multiple power modules. The cooling manifold may include a plurality of small heat sinks on one side of the manifold and a plurality of large heat sinks on the other side of the manifold to facilitate cooling of small power modules and inductor components, respectively. Additionally, capacitors are positioned around the perimeter of the manifold. To facilitate mechanical support for the capacitors, the plurality of large heat sinks are formed to be wider than the manifold. As a result, the plurality of large heat sinks form overhanging portions that extend beyond the perimeter of the manifold. The overhanging portions are further configured to act as thermal sinks for the capacitors, thereby extracting heat from the capacitors during operation.

As described in more detail herein, a compact cold plate design is more desirable for cooling high power density power electronics. Accordingly, the present disclosure depicts and describes embodiments of a power electronic system having a double-sided cold plate that provides liquid cooling through a manifold to a dense configuration of power electronic components. By implementing a manifold that is smaller in width and length than a plurality of adjacently positioned large heat sinks coupled to one side of the manifold, capacitors can be positioned around the perimeter of the manifold without increasing a footprint of the power electronic system.

Additionally, as described in more detail herein, the manifold may include through holes that are isolated from the fluid pathways within the manifold to provide electrical conduits from one side of the manifold to the other. The through holes may receive busbars that electrically connect electrical components positioned on opposite sides of the manifold. The through holes reduce the electrical pathway length between components, which for power electrical components can significantly reduce the resistance in the connections between components, thereby increases operating efficiency, and reduces heat generation. For example, power inductors located on one side of the manifold may be directly connected to power modules and/or a power electronic printed circuit board located on the opposite side of the manifold. Furthermore, in embodiments where capacitors are positioned around the perimeter of the manifold, paths between components on opposite sides of the manifold become limited and long because of the additional enclosure formed by the perimeter of capacitors.

The manifold is configured to have internal fluid pathways that deliver a fluid to a plurality of modular inserts that distribute the fluid to opposing sides of the manifold. The distributed fluid extracts heat collected by the plurality of heat sinks on both sides of the manifold to actively cool electrical components thermally coupled thereto. The plurality of heat sinks may be sized to correspond to the footprint of the power electronic devices that are intended to be cooled by the cooling manifold assembly. In that way, components of different sizes and heat loads may be cooled by the same cooling manifold assembly. For example, power modules and/or capacitors may be coupled to a first surface of the cooling manifold and power electronic printed circuit boards (PCBs) and/or inductors and transformers may be coupled to a second surface of the cooling manifold.

As described in more detail herein, power electronic assemblies include double-sided cold plates with overhanging heat sinks and through-body bus bars for high-power density power electronics. The embodiments provide a small package footprint for cooling a high-power density electronic system such as a power inverter or DC-DC converter. Additionally, the large heat sinks provide both cooling and mechanical support to the capacitors. Otherwise, without the large heat sinks' overhanging portion, the capacitors would merely be supported via their attachment to the PCB board, which is through soldered pins. Additionally, embodiments disclosed herein also include brackets that secure inductor components such as the magnetic cores to the printed circuit boards and the heat sinks. The brackets provide mechanical reinforcement and cooling effects to the inductor components. In addition, the mechanical brackets are designed to fit and secure left or right positioned inductor components, which is described in more detail herein.

Figure 1B:
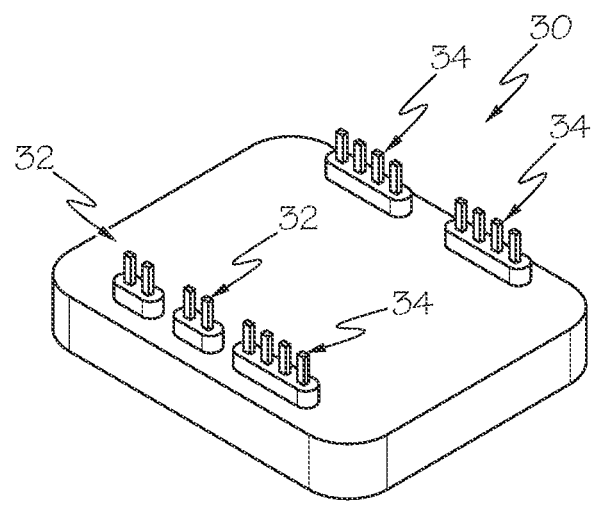
FIG. 1B schematically depicts a perspective view of an illustrative power module according to one or more embodiments shown and described herein.

Turning now to the figures, FIGS. 1A-1B depict various illustrative example power electronic components and assemblies that may be coupled to the cooling manifold for cooling. In particular, an illustrative example of an inductor for an inverter, booster and/or buck booster converter is depicted in FIG. 1A. The heat sink assembly 10 includes inductor PCB assemblies 11 coupled to a heat sink 24 is depicted. When inductors are energized, heat is generated by the coil and core of the inductor. That is, for example, a changing magnetic field can induce circulating loops of electric current in the conductive metal core. The energy in these currents is dissipated as heat in the resistance of the core material. The amount of energy lost increases with the area inside the loop of current. As depicted, the PCBs 12 include an embedded coil within the PCB material that is enclosed by a core 14A, 14B, which channels the magnetic field generated by the electrical current flowing through the embedded coil. The coil may also be a surface mounted coil coupled to a surface of the PCBs 12. Furthermore, it should be understood that the planar type inductor is merely on example of a planar magnetic component and that other planar magnetic configurations (e.g., a transformer) may be implemented in power electronic configurations.

The core may be made up of two parts, an "E" shaped portion 14A and an "I" shaped portion 14B that, when mated or brought into close contact with each other or positioned proximal to each other with an air gap between, provide magnetic field loops that operate to channel the magnetic field generated by the planar coil loop within the PCB 12. A bracket, which will be described in more detail with reference to FIG. 3D, operates to attach the core securely to the heat sink 24 and/or the manifold 110. A secure connection helps increase the heat transfer efficiency from the core to the cold plate of the cooling manifold. In some embodiments, the core may include an insulation layer 16 positioned between the "E" shaped portion 14A and the "I"

shaped portion 14B of the core. It should be understood that an EI type core is only one example core configuration that may be implemented to form an inductor core.

The PCB 12 also includes busbars 18. The busbars 18 are conductive connectors configured to electrically connect the inductor and/or other components of the PCB 12 to other components of a power system. The power system may be an electric vehicle powertrain, a motor inverter, a bi-directional DC-DC converter, or the like. As depicted in FIG. 1A, the heat sink 24 includes two inductor PCB assemblies 11. However, embodiments are not limited to a heat sink having only two, some embodiments may have more or less.

The heat sink assembly 10 depicted in FIG. 1A is an example of larger components that may be implemented in a power system and require cooling. The power system may also include power modules, such as the power module 30 depicted in FIG. 1B. The power module 30 may include power devices including switching components such as field-effect transistors (FETs) or the like. The power module 30 may operate as a control module for the electric vehicle powertrain, the motor inverter, the bi-directional DC-DC converter, or the like, for example. Accordingly, the power module 30 includes signal connectors 32 and power connectors 34. The signal connectors 32 and power connectors 34 may be electrically coupled to other power modules 30 or power components such as a planar inductor, capacitor or the like.

It should be understood that the aforementioned and described power components are a few examples of components implemented in power systems that may require cooling to operate at high voltages and/or high currents. To deliver compact power systems such as those for use in automotive applications it is advantageous to combine thermal management into modular cooling systems such as those described herein. However, since the size and heat management requirements for components of a power system vary, a modular cooling system that is asymmetric and configurable is needed. The asymmetry of the cooling system refers to the ability to manage large and small component with the same manifold, optionally or different sides of the cooling manifold as described herein while also providing an efficient means for electrically connecting the components.

Figure 2A:
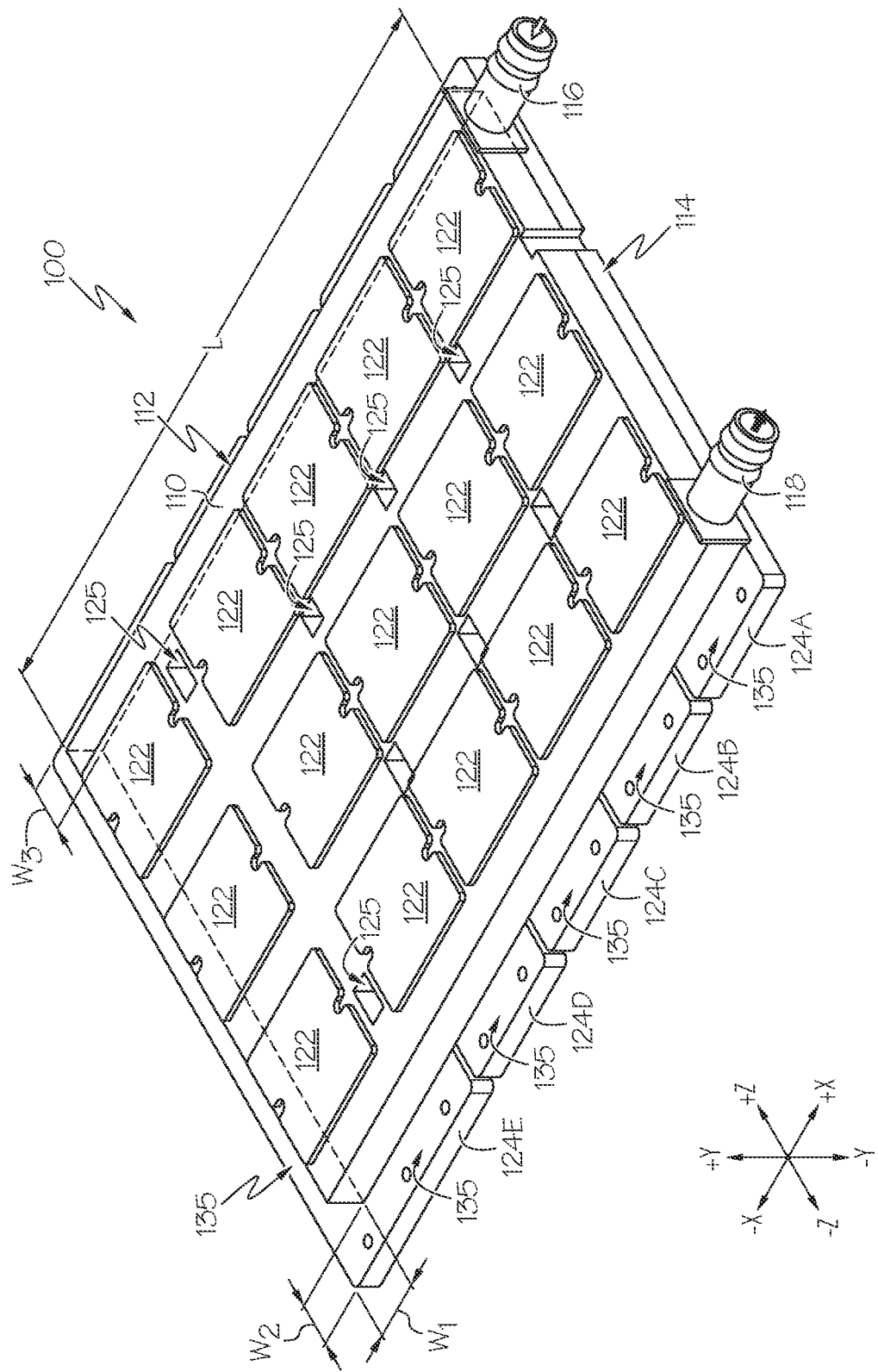
FIG. 2A schematically depicts a top perspective view of a double-sided cold plate having a manifold according to one or more embodiments shown and described herein.
Figure 2C:
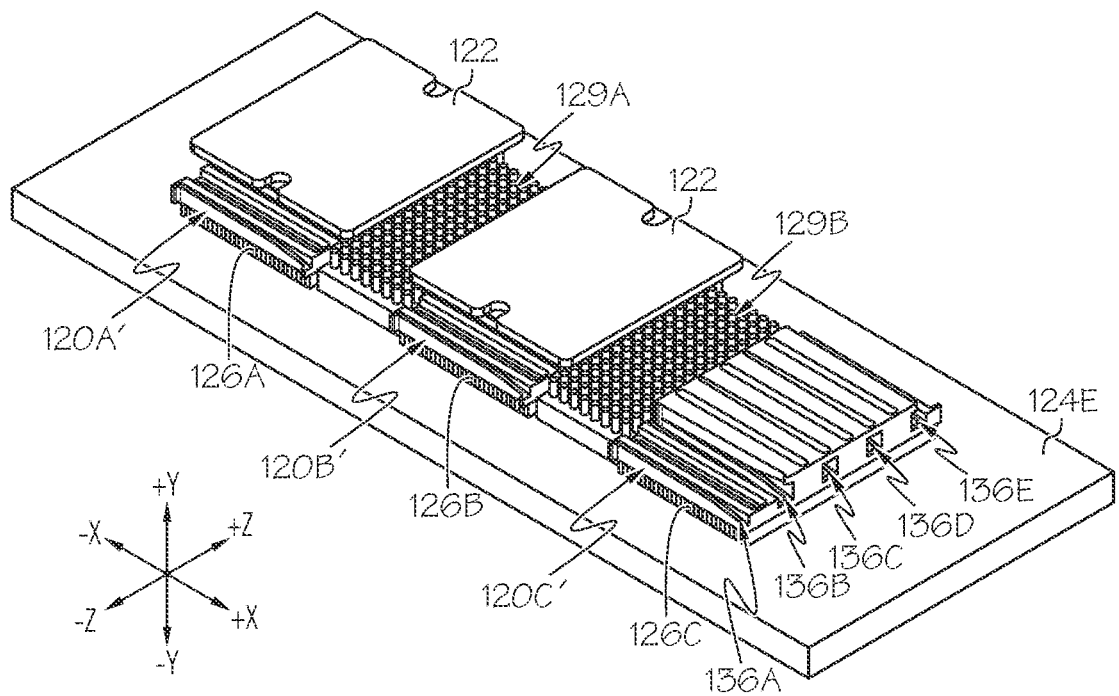
FIG. 2C schematically depicts a top perspective view of modular insert assemblies having an asymmetric flow distribution inserts for positioning within the manifold according to one or more embodiments shown and described herein.

FIGS. 2A-2C depict a double-sided cold plate 100. In particular, FIG. 2A depicts a top perspective view of a double-sided cold plate having a manifold. FIG. 2B depicts a partially exploded top perspective view of the double-sided cold plate depicted in FIG. 2A. FIG. 2C depicts a bottom view of the double-sided cold plate depicted in FIG. 2A. FIGS. 2A-2C will now described together as interrelated features may be visually depicted in one or more of the figures.

The double-sided cold plate includes a manifold 110, a plurality of first heat sinks 122, a plurality of second heat sinks 124, and a plurality of modular inserts configured within the manifold 110. The manifold 110 has a first surface 112 (also referred to herein as the top surface) and a second surface 114 (also referred to herein as the bottom surface) that is spaced apart from the first surface 112 by a thickness T of material making up the manifold 110. The manifold 110 is further defined by a predefined width $W_M$ and a length L. The thickness T of the manifold 110 defines four sides as depicted. The sides of the manifold 110 are referred to herein as side A, side B, side C, and side D. Side A and side C are opposite each other and side B and side D are opposite each other. Sides A and C extend widthwise along the manifold 110. Sides B and D extend lengthwise along the manifold 110. The manifold 110 may be made of non-conductive material such as a plastic, a ceramic, or a composite material. A recess 113 is formed within the manifold 110. The recess 113 within the manifold 110 may include an opening in the first surface 112 and an opening in the second surface 114. The openings are enclosed by heat sinks 122 and 124 that provide a thermal conductive surface for coupling a component that is intended to be cooled thereto.

The manifold 110 includes an inlet channel 116 and an outlet channel 118. The inlet channel 116 and the outlet channel 118 are fluidly coupled to fluid pathways within the manifold 110. The inlet channel 116 is configured to receive a cooling fluid. The inlet channel 116 is fluidly connected to the recess 113 of the manifold 110. The outlet channel 118 is configured to receive the cooling fluid from the recess 113 and expel the cooling fluid from the manifold 110. In some embodiments, the inlet channel 116 and the outlet channel 118 extend through length, L, of the manifold 110. Such embodiments may enable multiple manifolds 110 to be fluidly coupled. However, the manifold 110 depicted herein is a single contained unit having multiple recesses and fluid pathways formed within the manifold 110.

The manifold 110 further includes a modular insert. The modular insert includes a flow distribution insert 120 and plate fins 126 positioned on opposite sides of the flow distribution insert 120. For example, the first plate fin (not shown) is positioned between the heat sink 122 and the flow distribution insert 120. The second plate fin 126 is positioned between the heat sink 124 and the flow distribution insert 120. The plate fins 126 may include a plurality of micro-channels that are defined by spaces between plates. The plurality of micro-channels enables heat to be transferred from the plates to cooling fluid that flows therebetween. However, it should be understood that embodiments are not limited to plate fins 126. That is, other types of heat exchangers such as pin fins, porous wick structures, or the like may be implemented to facilitate the transfer of heat from electronic devices coupled to the heat sinks 122 and 124 to the cooling fluid flowing through the manifold 110.

In some embodiments, the first surface 112 of the manifold 110 includes multiple rows oriented along the length L of the manifold each with three openings 113 that extend through the manifold 110 forming a recess therein. The second surface 114 of the manifold 110 also includes multiple rows oriented along the length L of the manifold, but each row may only include one opening 113 that extend through the manifold 110 forming a recess therein. The openings 113 on the first surface 112 of the manifold 110 are enclosed by a plurality of first heat sinks 122.

The manifold 110 further includes a plurality of modular inserts, each of which correspond to an opening in the first surface 112 of the manifold 110. As described above, a modular insert includes a flow distribution insert 120 and plate fins 126 disposed on opposing sides of the flow distribution insert 120. Plate fins 126 and flow distribution inserts 120 are only depicted for one row in FIG. 2B, but it is understood that the depicted embodiment may be replicated for each row of the manifold 110. The last row of the manifold 110, for example the row farthest from the inlet channel 116 and outlet channel 118 as depicted in FIG. 2B, may include an asymmetric flow distribution insert 120' and a larger array of plate fins 126 than other rows. That is, the last row of the manifold may be configured to accommodate larger inductor components and/or a different positioning of the components on the manifold 110 with respect to the overhanging portion (identified by $W_1$ in FIG. 2A) created by the last 124E of the plurality of second heat sinks 124.

For example, the plate fins 126 and/or pin fins 129 may be offset (e.g., biased toward side C of the manifold 110) on the last 124E of the plurality of second heat sinks 124.

Referring to FIGS. 2C, 2D, 2E, and 2F, illustrative embodiments of an asymmetric flow distribution insert 120' (e.g., individually 120A', 120B', and 120C') are depicted. FIG. 2C depicts a perspective view of the last 124E of the plurality of second heat sinks 124 (also referred to herein as the "end second heat sink 124E") without the manifold 110 so that the end second heat sink 124E and the modular insert having an asymmetric flow distribution insert 120' and plate fins 126 (e.g., 126A, 126B, 126C) and 126' (FIG. 2D) positioned on opposite sides of the asymmetric flow distribution insert 120'. Interspersed between the plate fins 126A, 126B, and 126C, a set of pins fins 129A and 129B or the like may be positioned therebetween. That is, as fluid flows from one asymmetric flow distribution insert 120' (e.g., each asymmetric flow distribution inserts 120A', 120B', and 120C' associated with the plate fins 126A, 126B, and 126C, the fluid may flow through the set of pins fins 129A and 129B to facilitate additional each transfer between the fluid and components coupled to the end second heat sink 124E.

In operation, the asymmetric flow distribution insert 120' fluid from the inlet channel 116 or an upstream asymmetric flow distribution insert 120' (e.g., asymmetric flow distribution insert 120B' receives fluid from asymmetric flow distribution insert 120A', which is positioned upstream). The fluid enters the asymmetric flow distribution insert 120' through the inlet channels 136A, 136B, 136C, 136D, and 136E. The asymmetric flow distribution insert 120' diverts fluid toward the first surface 112 and the second surface 114 of the manifold 110 through openings along the length of inlet channels 136A, 136B, 136C, 136D, and 136E. This diversion of fluid introduces fluid into the plate fins 126 and 126'. The fluid flow through the micro-channels of the plate fins 126 and 126' and returns to the asymmetric flow distribution insert 120' via the openings along the length of the outlet channels 138 adjacent and interspersed between the inlet channels 136A, 136B, 136C, 136D. The fluid then flows out the outlet channels 138 of one asymmetric flow distribution insert 120' and optionally through a set of pin fins 129A or another heat exchanger arrangement. The fluid subsequently flows into the inlet channels 136 of the second asymmetric flow distribution insert 120B' and subsequently the third asymmetric flow distribution insert 120C' after flowing through the second asymmetric flow distribution insert 120B'.

Figure 2D:
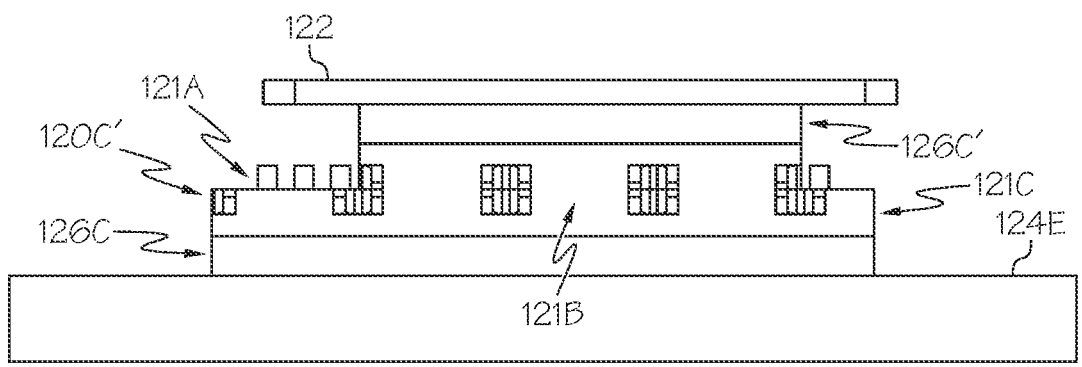
FIG. 2D schematically depicts a cross-sectional side view of modular insert assemblies according to one or more embodiments shown and described herein.

Referring to FIG. 2D, a cross-sectional side view of an illustrative embodiment of the asymmetric flow distribution insert 120C' (and collectively 120') coupled to the end second heat sink 124E is depicted. The asymmetric flow distribution insert 120C' is coupled to plate fins 126C and 126C' on the top and bottom side of the asymmetric flow distribution insert 120C'. The plate fins 126C are further coupled to the end second heat sink 124E and the plate fins 126C' are coupled to the first heat sinks 122. As described in more detail with reference to FIG. 2E, the asymmetric flow distribution insert 120C' (and also asymmetric flow distribution inserts 120A' and 120B', which are not depicted in FIG. 2D) include asymmetric flanges 121A and 121C configured on a bottom half of the asymmetric flow distribution inserts 120' and extending from the center portion 121B of the asymmetric flow distribution inserts 120' so that the asymmetric flow distribution inserts 120' are thermally coupled to a larger surface area the end second heat sink 124E as compared to the flow distribution inserts 120. The center portion 121B of the asymmetric flow distribution inserts 120' is similar to the flow distribution inserts 120 depicted and described herein.

Figure 2E:
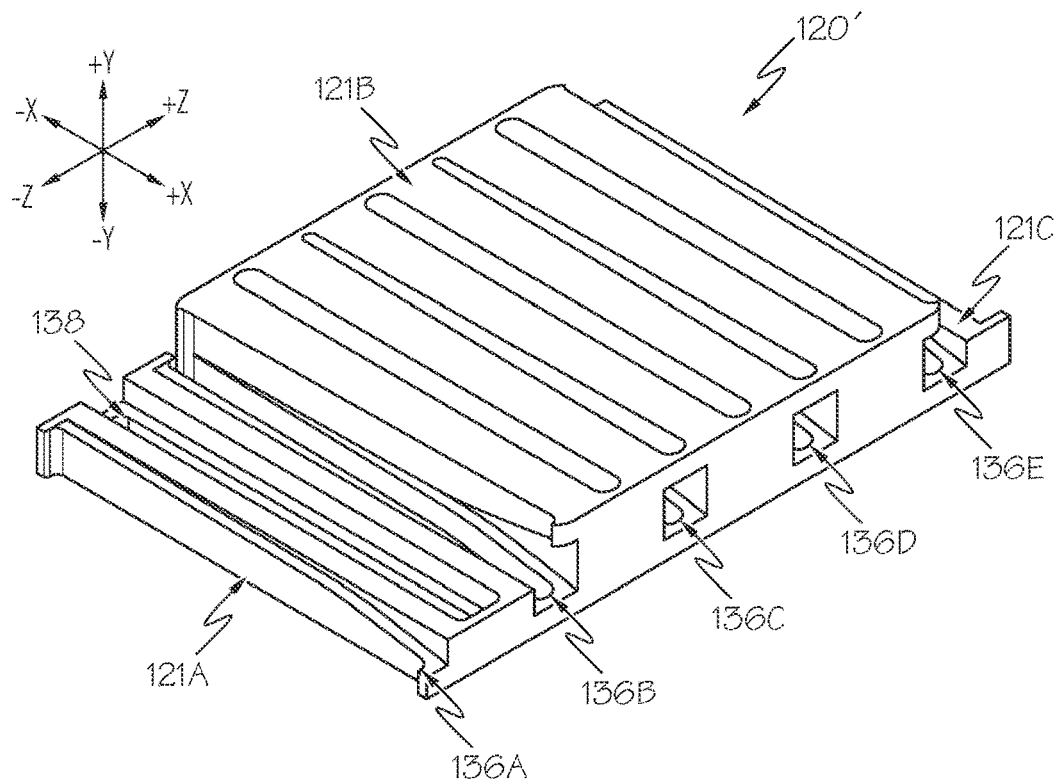
FIG. 2E schematically depicts a top perspective view of an asymmetric flow distribution insert according to one or more embodiments described herein.

Referring to FIG. 2E, the asymmetric flow distribution inserts 120', unlike the flow distribution inserts 120, include asymmetric flanges 121A and 121C configured on a bottom half of the asymmetric flow distribution inserts 120' and extending from the center portion 121B of the asymmetric flow distribution inserts 120'. In some embodiments, the asymmetric flow distribution inserts 120' may only include one asymmetric flange 121A or 121C. The asymmetric flange 121A or 121C include one or more inlet channels 136 and/or outlet channels 138. In some embodiments, a first asymmetric flange 121A may be larger than the second asymmetric flange 121C. For example, the first asymmetric flange 121A may include more inlet channels 136 and/or outlet channels 138 and/or have a larger surface area that is thermally coupled to the end second heat sink 124E than the second asymmetric flange 121C. The asymmetric flow distribution insert 120' distributes coolant non-uniformly to two sides of the manifold 110 so that the manifold can accommodate different size plate fins 126 and 126' having different thermally coupled surface areas. The asymmetric flow distribution insert 120' and heat sinks coupled to the different sized plate fins 126 and 126' fin areas allow the double-sided cold plate to cool electronic components having different footprints without sacrificing the cooling of the bigger electronics.

As depicted in FIG. 2E, the illustrative asymmetric flow distribution insert 120' includes a plurality of inlet channels 136A, 136B, 136C, 136D, and 136E (collectively referred to as inlet channels 136). The asymmetric flow distribution insert 120' also includes a plurality outlet channels 138. The inlet channels 136 receive fluid and direct it towards the first and second surfaces 112 and 114 of the manifold 110. After the fluid impinges the first and second heat sinks or flows through the plate fins 126 and 126', the fluid returns into the asymmetric flow distribution insert 120' through outlet channels 138. The fluid collected by the outlet channels 138 is directed out of the asymmetric flow distribution insert 120'. The inlet channels 136A, 136B, and 136E and the corresponding outlet channels 138 positioned in the asymmetric flanges 121A and 121C operate in a similar fashion as the inlet channels 136C and 136D and corresponding outlet channels 138 within the center portion 121B of the asymmetric flow distribution insert 120'. However, the inlet channels 136A, 136B, and 136E and the corresponding outlet channels 138 positioned in the asymmetric flanges 121A and 121C may be half channels. That is, they may not have a top portion that encloses the channel. Instead, the inlet channels 136A, 136B, and 136E and the corresponding outlet channels 138 may be enclosed by a portion of the manifold 110 on one side (e.g., the side facing the first surface 112) and the plate fins 126 on the side facing the second surface 114 of the manifold 110.

Figure 2F:
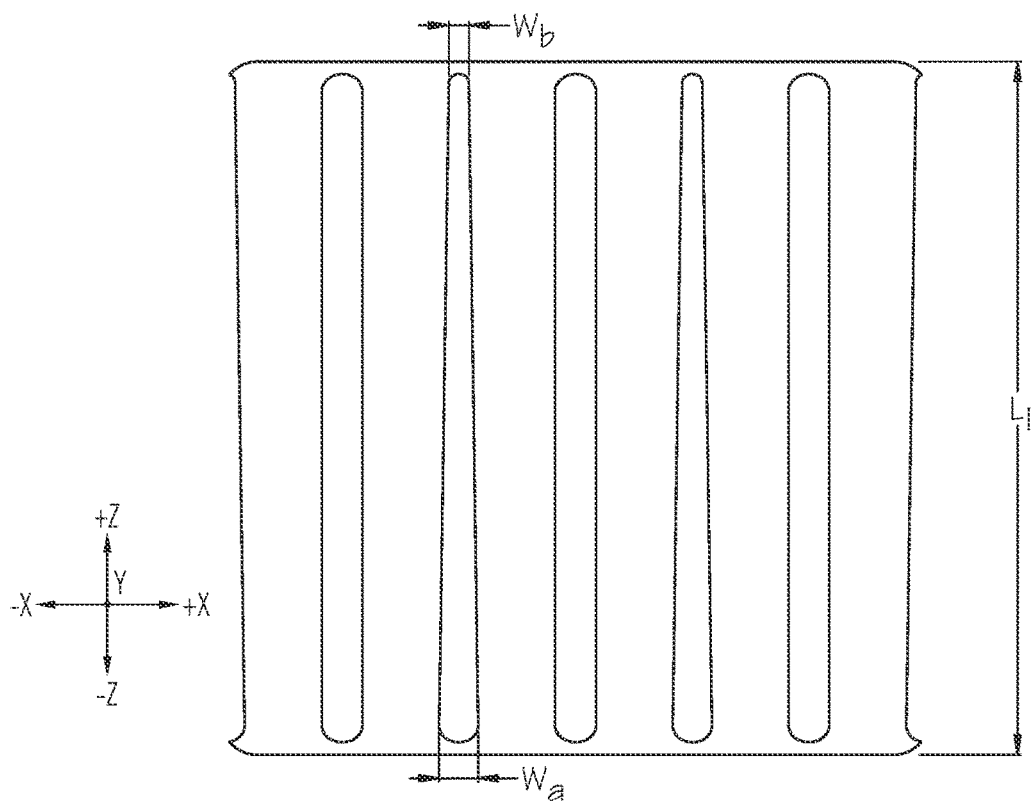
FIG. 2F schematically depicts a top surface view of an asymmetric flow distribution insert and flow distribution insert according to one or more embodiments described herein.

Referring now to FIG. 2F, a top surface view of an asymmetric flow distribution insert 120' and/or the flow distribution insert 120 is depicted. Either the asymmetric flow distribution insert 120' or the flow distribution insert 120 may be configured with the following inlet channel 136 design. As depicted, the inlet channels 136 may be tapered along their length to improve the distribution of fluid out of the channel toward and into the plate fins 126 and 126'. For example, the inlet channel 136 at one end along its length $L_I$ may have a width $W_a$ of an opening in the inlet channel 136 that is wider than a width $W_b$ of the opening at the opposite end of the inlet channel 136. That is, from one end to the other end of the inlet channel along its length $L_I$, the opening that distributes fluid into the fluidly coupled plate fins 126 and 126' may be tapered. The tapered channel enables flow balancing within each of the cooling cells in the manifold 110.

Referring back to FIG. 2B, the second surface 114 of the manifold 110, a plurality of second heat sinks 124 (e.g., 124A, 124B, 124C, 124D, and 124E) may be configured to enclose the opening 113 on the second surface 114 of the manifold 110. The plurality of second heat sinks 124 are positioned adjacent each other along the length L of the manifold 110 and coupled to the second surface 114 of the manifold 110. The plurality of second heat sinks 124 may be coupled to the manifold 110. The plurality of second heat sinks 124 are coupled to one or more heat exchangers such as plate fins 126A, 126B, 126C and/or pin fins 129A and 129B. The plate fins 126A, 126B, and 126C correspond to the modular inserts for each of the openings 113 on the first surface 112. The pin fins 129A and 129B may be installed between each of the plate fins 126A, 126B, and 126C so that plurality of second heat sinks 124, which is configured to accommodate lager components for cooling than the plurality of first heat sinks 122, may be further cooled. That is, the pin fins 129A and 129B offer additional heat dissipation and interaction with the cooling fluid as it flows from one flow distribution insert 120 to another flow distribution insert 120.

The manifold 110 has a predefined length L, width $W_M$, and thickness T. Each of the plurality of second heat sinks 124 may have a common width $W_H$. The width $W_H$ of the plurality of second heat sinks 124 is greater than width $W_M$ of the manifold 110. Accordingly, when the plurality of second heat sinks 124 are coupled to the second surface 114 of the manifold 110 portions of the plurality of second heat sinks 124 extend beyond the width $W_M$ of the manifold 110. These portions are referred to herein as "overhang portions." The overhang portion of the plurality of second heat sinks 124 are the portions that extend beyond the width $W_M$ of the manifold 110. For example, as depicted in FIG. 2A, the overhang portions 135 of the plurality of second heat sinks 124 extend beyond the width $W_M$ of the manifold 110 by a distance or width $W_2$ and $W_3$, on each side of the manifold 110. Additionally, in some embodiments, the last 124E of the plurality of second heat sinks 124 may include an overhang portion 135 that extends beyond the length L of the manifold. For example, as depicted in FIG. 2A, the overhang portion 135 of the last 124E of the plurality of second heat sinks 124 extends beyond the length L of the manifold 110 by a distance or width $W_1$. Together, each of these overhang portions 135 creates a support structure for receiving and supporting components. For example, in some embodiments, the components may be electrical components such as capacitors.

In some embodiments, the manifold 110 may be manufactured, printed, or molded to include through holes 125 that extend from the first surface 112 of the manifold 110 through the thickness of the manifold 110 to the second surface 114. The through holes 125 are configured so they do not intersect fluid pathways within the manifold 110. The through holes 125, as depicted and described in more detail herein, provide direct conduits from one side of the manifold 110 to the other. Since some manifolds 110 are single formed units, there is not an option to incorporate conduits between or among the rows and columns of openings 113. Accordingly, the through holes 125 can provide conduits for positioning busbars 18 or other electrical or mechanical connections between components located on opposite sides of the manifold 110.

The plurality of second heat sinks 124, for example, with reference to FIG. 2G, include corresponding holes or cutouts 125' to the through holes 125 of the manifold 110. That is, since the plurality of second heat sinks 124 generally cover a majority of the second surface 114 of the manifold 110, in order for components coupled to the plurality of second heat sinks 124 to have access to the through holes 125 in the manifold 110, corresponding holes or cutouts 125' may be needed.

Additionally, as depicted in FIG. 2G, the plurality of second heat sinks 124A-124E may be contoured heat sinks such that the inductor or transformer PCB assemblies 11 (FIG. 1A) can be thermally coupled to the plurality of second heat sinks 124 across the largest surface area. That is, referring to FIGS. 1A and 2G, each of the inductor PCB assemblies 11, as described above include a PCB 12 with a core 14A and 14B enclosing a portion of the PCB 12. The outer surfaces of the core 14A and 14B and the surfaces of the PCB 12 may have different planes. Accordingly, a single plane heat sink would only be able to contact the surface of the core 14A and not the surface of the PCB 12. To address this, the plurality of second heat sinks 124 may be designed to have a first surface formed within a cavity 115' that thermally couples to the core 14A and a second surface 115 that thermally and mechanically couples to the PCB 12.

Figure 3A:
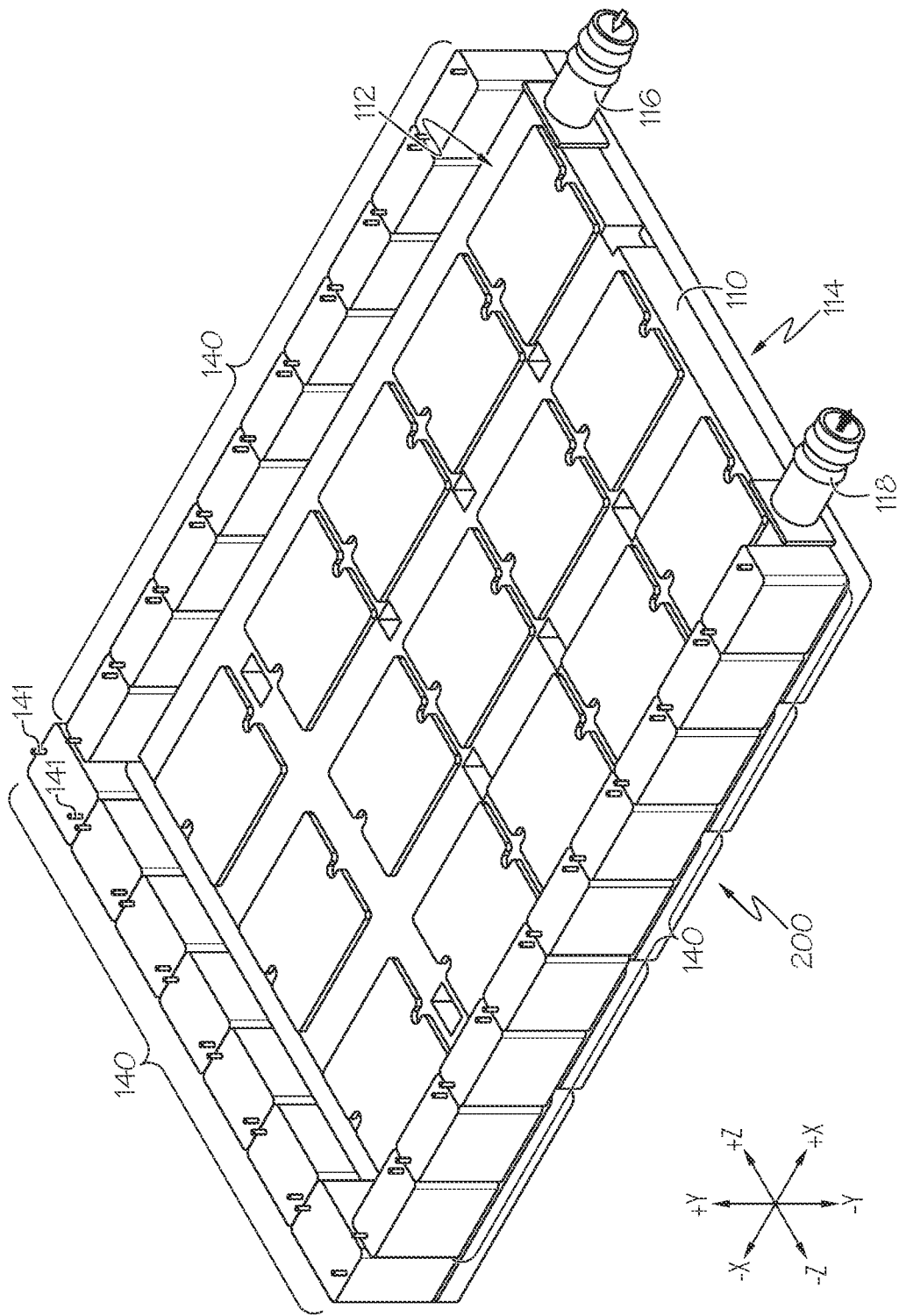
FIG. 3A depicts a top perspective view of partially assembled power electronic system having the double-sided cold plate according to one or more embodiments shown and described herein.
Figure 3B:
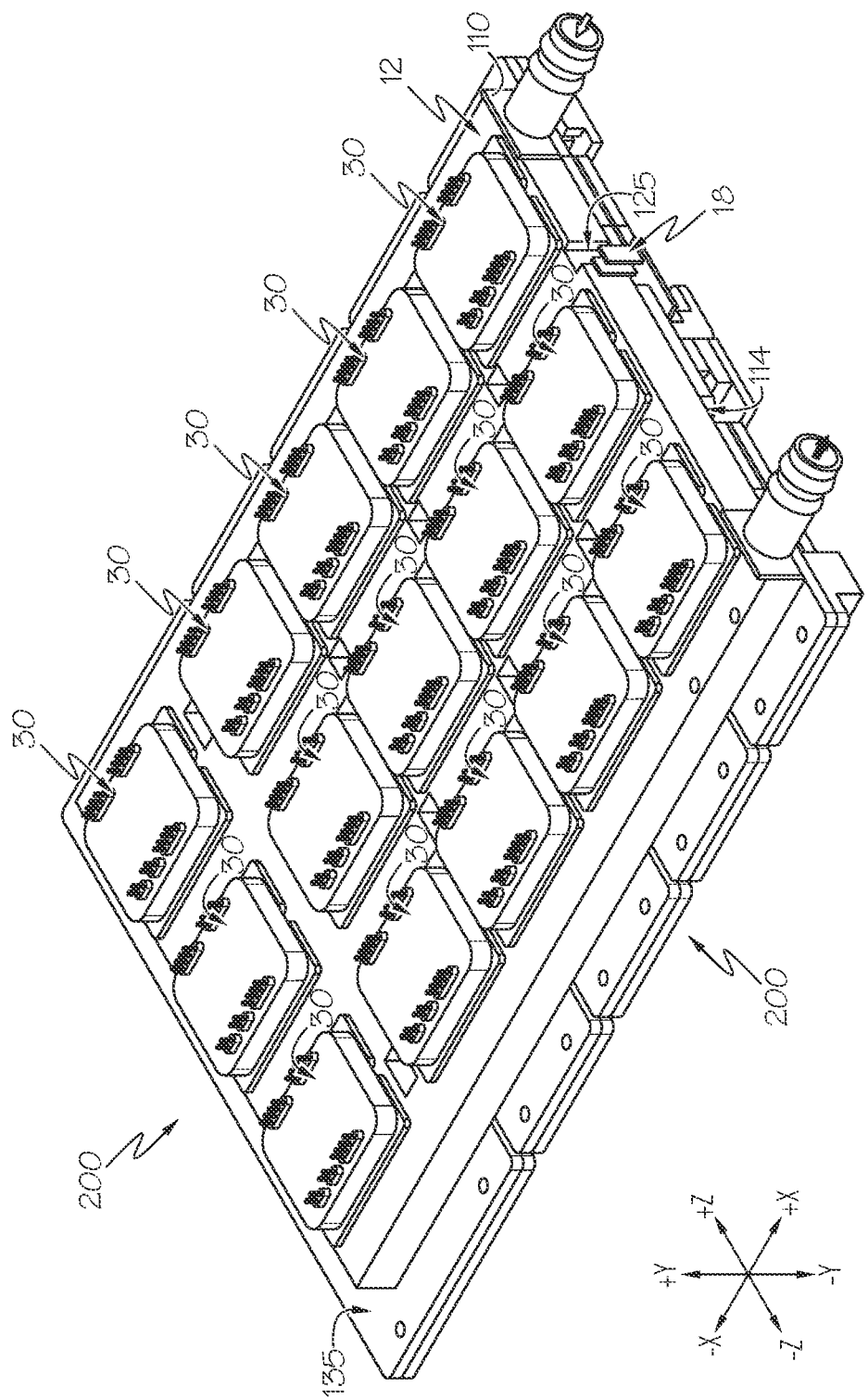
FIG. 3B depicts a top perspective view of the partially assembled power electronic system having a plurality of power modules coupled to the double-sided cold plate according to one or more embodiments shown and described herein.
Figure 3C:
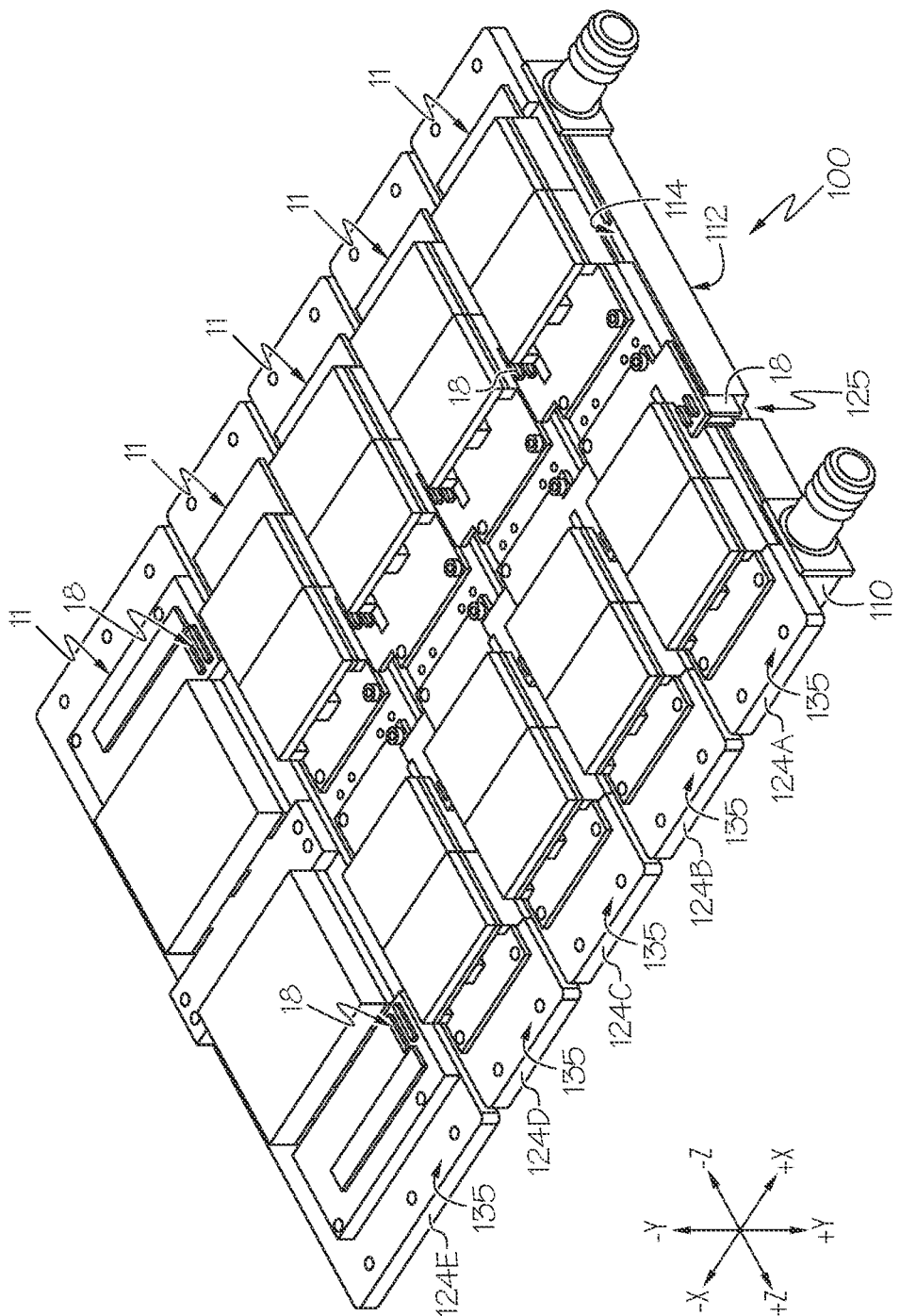
FIG. 3C depicts a bottom perspective view of the partially assembled power electronic system having a inductor PCB assemblies coupled to the double-sided cold plate according to one or more embodiments shown and described herein.

Turning now to FIGS. 3A-3C, various perspective views of a partially assembled power electronic system having the double-sided cold plate described herein are depicted. In particular, FIG. 3A depicts a top perspective view of a partially assembled power electronic system having the double-sided cold plate. As described hereinabove with reference to FIGS. 2A and 2B, the plurality of second heat sinks 124 create overhang portions 135 around the perimeter of the manifold 110. The overhang portions 135, as depicted in FIG. 3A, may receive a plurality of capacitors 140. One end of the capacitors 140 may be seated against and/or thermally coupled to the overhang portions 135 of the plurality of second heat sinks 124. The capacitors may be thermally coupled to the heat sinks 124 with a thermal interface material interposed between the two components. As such, the terminals 141 of the capacitors 140 may be positioned in an upward direction (+Y direction) away from the double-sided cold plate 100 for electrical coupling to a power electronic PCB or other components.

FIG. 3B also depicts a top perspective view of the partially assembled power electronic system having the double-sided cold plate. However, here, the capacitors 140 depicted in FIG. 3A are not shown. Instead, the partially assembled power electronics system 300 is depicted with a plurality of power modules 30 installed on the first surface 112 of the manifold 110. Each of the plurality of power modules 30 are coupled to the plurality of first heat sinks 122 on the first surface 112 of the manifold 110. On the other side of the double-sided cold plate 100, as depicted in the bottom perspective view of the partially assembled power electronic system in FIG. 3C, a plurality of inductor PCB assemblies 11 are installed on the second surface 114 of the manifold 110. Each of the plurality of inductor PCB assemblies 11 are coupled to the plurality of second heat sinks 124 on the second surface 114 of the manifold 110. Additionally, busbars 18 extending from the PCB 12 of the plurality of inductor PCB assemblies 11 are configured to extend through the through holes 125 in the manifold 110, when the plurality of inductor PCB assemblies 11 are thermally and mechanically coupled to the plurality of second heat sinks 124 coupled to the manifold 110.

Figure 3D:
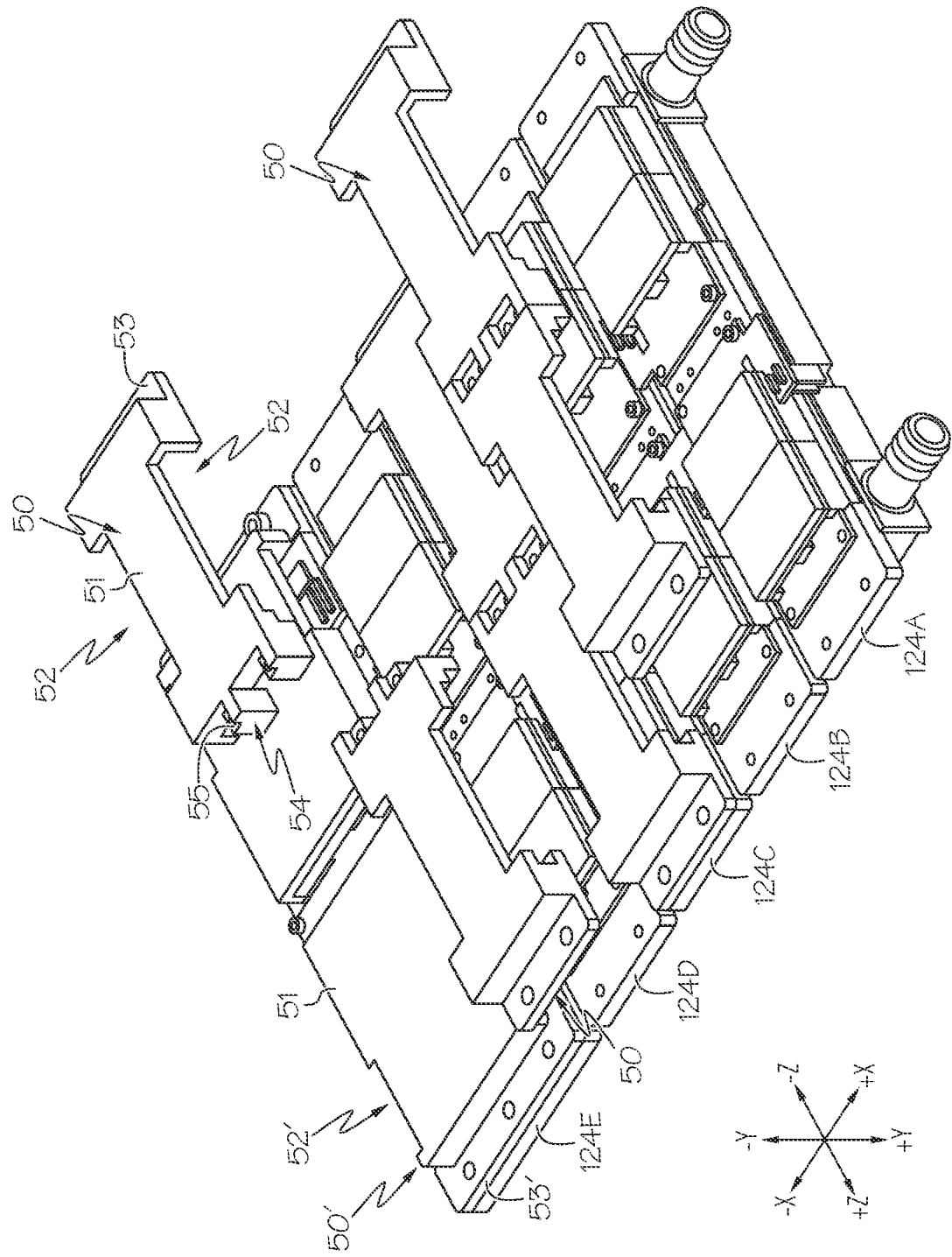
FIG. 3D depicts a bottom perspective view of the partially assembled power electronic system having a inductor PCB assemblies and associated brackets coupled to the double-sided cold plate according to one or more embodiments shown and described herein.

Turning to FIG. 3D, the same bottom perspective view of the partially assembled power electronic system depicted in FIG. 3C is now illustrated showing the assembly of the brackets 50 and 50'. The brackets 50 and 50' secure the plurality of inductor PCB assemblies 11 to the plurality of second heat sinks 124. The brackets 50 and 50' are designed interconnect with an adjacent bracket 50 and 50' along the same row and can further be installed over either the left or right column of inductor PCB assemblies 11 along the length L of the manifold 110. The last 124E of the plurality of second heat sinks 124, which is positioned along side C (FIG. 2A) of the manifold 110 may have a larger and slight different bracket 50' than the brackets 50 installed with the inductor PCB assemblies 11 on the plurality of second heat sinks 124A, 124B, 124C, and 124D.

The bracket 50 includes a first member 51 forming a top surface of the bracket 50. The bracket 50 includes a flange 53 at one and one or more mounting blocks 54 with a through hole 55 for receiving a fastener configured at the opposite end. The sides of the first member 51 between the flange 53 and the opposite end may include openings 52 for allowing heat to escape and further reduce the amount of heat buildup in the bracket 50 because of magnetic flux interacting with the metal. The one or more mounting blocks 54 are symmetrically positioned such that a space on either side of the one or more mounting blocks 54 is capable of receiving a mounting block 54 from an adjacently installed bracket 50. The brackets 50 and 50' may be secured to the plurality of second heat sinks 124 with fasteners such as screws or bonded thereto using an adhesive, solder, or other material.

Figure 4A:
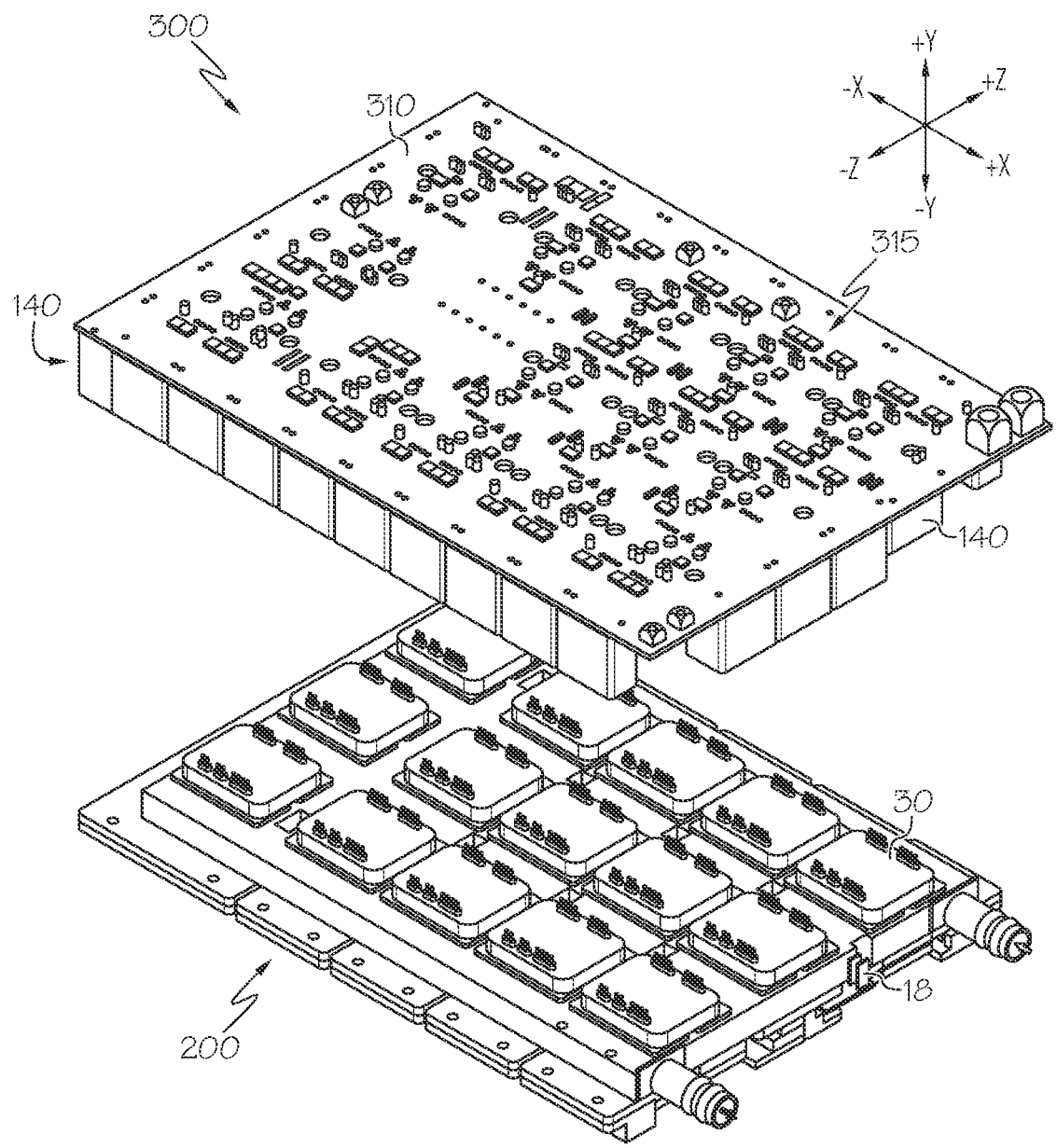
FIG. 4A depicts an exploded top perspective view of the power electronic system according to one or more embodiments shown and described herein.
Figure 4B:
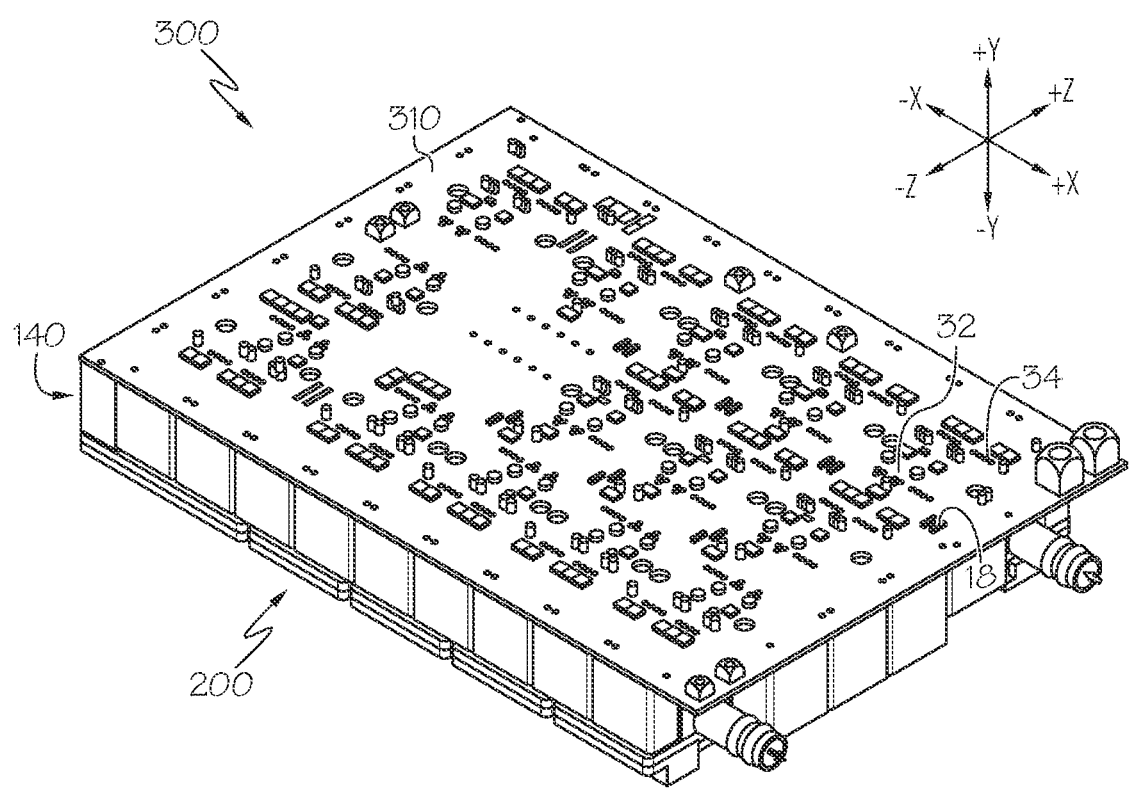
FIG. 4B depicts an assembled top perspective view of the power electronic system according to one or more embodiments shown and described herein.

Referring now to FIGS. 4A and 4B, an exploded top perspective view and an assembled top perspective view of the power electronic system 300 incorporating a double-sided cold plate is depicted. The double-sided cold plate 200 includes a plurality of power modules 30 coupled to the first surface 112 of the manifold 110 and a plurality of inductor PCB assemblies 11 coupled to the second surface 114 of the manifold 110. The power electronic system 300 also includes a power electronics PCB 310. The power electronics PCB 310 includes a plurality of active and passive electrical components 315. The electrical components 315 are mounted to the power electronics PCB 310 and may be configured to control the operation of the power electronic system 300. The power electronics PCB 310 also includes electrical connections for electrically connecting the plurality of power modules 30, the plurality of inductor PCB assemblies 11, and the capacitors together. Busbars 18 extending from the plurality of inductor PCB assemblies 11 may be received in through holes, slots, or other electrical junctions on the power electronics PCB 310. Similarly, the signal connectors 32 and power connectors 34 from the plurality of power modules 30 may be electrically coupled to the power electronics PCB 310 when the power electronics PCB 310 is joined to the double-sided cold plate 200. The power electronics PCB 310 may be structurally joined and supported by the capacitors 140 when seated with the overhang portions 135 of the plurality of second heat sinks 124. Turning to FIG. 4B, the assembled top perspective view of the power electronic system 300 incorporating a double-sided cold plate 200 is depicted. Here, the power electronics PCB 310 is joined to the double-sided cold plate 200. The capacitors 140 are seated and/or coupled to the overhang portions 135 of the plurality of second heat sinks 124. Additionally, the busbars 18, the signal connectors 32, and the power connectors 34 are electrically coupled to the power electronics PCB 310. The double-sided cold plate design enables a large density of power electronic components to be packed in a highly dense and small configuration while also providing cooling to key components that contribute to heat generation of the system. The design increases the system power density by 15 percent or more as compared to systems that do not incorporate capacitor components around the perimeter of the manifold 110.

It should now be understood that a double-sided cold plate may include a manifold, a plurality of first heat sinks, and a plurality of second heat sinks. The manifold is defined by a first width, a first length, and a thickness. The manifold includes a plurality of openings extending from a first surface of the manifold through the thickness of the manifold to a second surface of the manifold forming recesses within the manifold and an inlet channel and an outlet channel fluidly coupled to the recesses within the manifold. The plurality of first heat sinks are coupled to the first surface of the manifold enclosing the plurality of openings on the first surface. The plurality of second heat sinks are positioned adjacent each other along the first length of the manifold and coupled to the second surface of the manifold enclosing the plurality of openings on the second surface, a width of the plurality of second heat sinks is greater than the first width of the manifold thereby forming an overhanging portion on each lengthwise side of the manifold, the overhanging portion configured to mechanically support a plurality of electrical components positioned around a perimeter of the manifold.

Furthermore, embodiments presented herein incorporate the double-sided cold plate within a power electronic system. The power electronic system includes a double-sided cold plate includes a manifold having a first width, a first length, and a thickness, a plurality of first heat sinks coupled to a first surface of the manifold, and a plurality of second heat sinks positioned adjacent each other along the first length of the manifold and coupled to a second surface of the manifold, a width of the plurality of second heat sinks is greater than the first width of the manifold thereby forming an overhanging portion on each lengthwise side of the manifold. The power electronic system further includes a plurality of capacitors mechanically supported on and thermally coupled to the overhanging portion of the plurality of second heat sinks, a plurality of power modules thermally coupled to the plurality of first heat sinks, and a plurality of inductors thermally coupled to the plurality of second heat sinks.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A double-sided cold plate, comprising:
   a manifold comprising openings extending from a first surface of the manifold through the manifold to a second surface of the manifold forming recesses within the manifold and an inlet channel and an outlet channel fluidly coupled to the recesses within the manifold;
   a plurality of first heat sinks coupled to the first surface of the manifold enclosing the openings on the first surface; and
   a plurality of second heat sinks positioned adjacent each other along a length of the manifold and coupled to the second surface of the manifold, enclosing the openings on the second surface, a width of the plurality of second heat sinks is greater than a width of the manifold thereby forming an overhanging portion on each lengthwise side of the manifold, the overhanging portion configured to mechanically support a plurality of electrical components positioned around a perimeter of the manifold.

2. The double-sided cold plate of claim 1, wherein one of the plurality of second heat sinks extends beyond the length of the manifold, forming an overhanging portion on one of the widthwise sides of the manifold.

3. The double-sided cold plate of claim 2, wherein the plurality of electrical components positioned around the perimeter of the manifold are mechanically supported and thermally coupled to the overhanging portions of the plurality of second heat sinks extending beyond the perimeter of the manifold.

4. The double-sided cold plate of claim 1, wherein the manifold defines a plurality of through holes and the plurality of second heat sinks, the plurality of through holes configured to receive busbar connections between electrical components positioned on opposite sides of the double-sided cold plate.

5. The double-sided cold plate of claim 1, further comprising a plurality of modular inserts, one of each positioned within the recesses between each of the plurality of first heat sinks coupled to the first surface and the plurality of second heat sinks coupled to the second surface, the plurality of modular inserts being fluidly coupled to the inlet channel and the outlet channel and are configured to direct fluid received from the inlet channel through the recesses and out the outlet channel.

6. The double-sided cold plate of claim 1, wherein the plurality of second heat sinks comprise one or more plate fins extending from a first surface of the plurality of second heat sinks into the recesses of the manifold.

7. The double-sided cold plate of claim 6, wherein the one or more plate fins are fluidly coupled to the inlet channel and the outlet channel.

8. The double-sided cold plate of claim 1, wherein the plurality of second heat sinks comprise one or more pin fins extending from a first surface of the plurality of second heat sinks into the recesses of the manifold.

9. The double-sided cold plate of claim 1, wherein the plurality of electrical components positioned around the perimeter of the manifold are capacitors.

10. A power electronic system, comprising:
a double-sided cold plate comprising:
  a manifold,
  a plurality of first heat sinks coupled to a first surface of the manifold,
  a plurality of second heat sinks positioned adjacent each other along a length of the manifold and coupled to a second surface of the manifold, a width of the plurality of second heat sinks is greater than a first width of the manifold thereby forming an overhanging portion on each lengthwise side of the manifold;
a plurality of capacitors mechanically supported on and thermally coupled to the overhanging portion of the plurality of second heat sinks;
a plurality of power modules thermally coupled to the plurality of first heat sinks; and
a plurality of inductors thermally coupled to the plurality of second heat sinks.

11. The power electronic system of claim 10, wherein one of the plurality of second heat sinks extends beyond the length of the manifold forming an overhanging portion on one of the widthwise sides of the manifold.

12. The power electronic system of claim 10, wherein the overhanging portions of the plurality of second heatsinks extend beyond a perimeter of the manifold, and wherein a plurality of electrical components are positioned around the perimeter of the manifold and are mechanically supported and thermally coupled to the overhanging portions of the plurality of second heat sinks extending beyond the perimeter of the manifold.

13. The power electronic system of claim 10, wherein the manifold defines a plurality of through holes and the plurality of second heat sinks, the plurality of through holes configured to receive busbar connections between electrical components positioned on opposite sides of the double-sided cold plate.

14. The power electronic system of claim 13, further comprising a power electronic printed circuit board (PCB) positioned adjacent the first surface of the manifold and coupled to the plurality of capacitors such that the plurality of capacitors are positioned between the power electronic PCB and the overhanging portion of the plurality of second heat sinks.

15. The power electronic system of claim 14, wherein the power electronic PCB is electrically coupled to the plurality of capacitors, the plurality of power modules, and the plurality of inductors.

16. The power electronic system of claim 13, wherein the plurality of inductors are mounted on print circuit boards on the second surface of the manifold, the printed circuit boards having busbars extending through the plurality of through holes.

17. The power electronic system of claim 10, wherein the manifold comprises openings extending from a first surface of the manifold through a thickness of the manifold to a second surface of the manifold forming recesses within the manifold and an inlet channel and an outlet channel fluidly coupled to the recesses within the manifold.

18. The power electronic system of claim 17, further comprising a plurality of modular inserts one of each positioned within the recesses between each of the plurality of first heat sinks coupled to the first surface and the plurality of second heat sinks coupled to the second surface, the plurality of modular inserts are fluidly coupled to the inlet channel and the outlet channel and are configured to direct fluid received from the inlet channel through the recesses and out the outlet channel.

19. The power electronic system of claim 17, wherein the plurality of second heat sinks comprise one or more plate fins extending from a first surface of the plurality of second heat sinks into the recesses of the manifold, the one or more plate fins are fluidly coupled to the inlet channel and the outlet channel.

20. The power electronic system of claim 17, wherein the plurality of second heat sinks comprise one or more plate fins extending from a first surface of the plurality of second heat sinks into the recesses of the manifold.

* * * * *